United States Patent
Kim

(10) Patent No.: US 11,856,769 B2
(45) Date of Patent: Dec. 26, 2023

(54) SEMICONDUCTOR DEVICE WITH SINGLE POLY NON-VOLATILE MEMORY DEVICE AND MANUFACTURING METHOD

(71) Applicant: KEY FOUNDRY CO., LTD., Cheongju-si (KR)

(72) Inventor: Su Jin Kim, Cheongju-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 71 days.

(21) Appl. No.: 17/531,873

(22) Filed: Nov. 22, 2021

(65) Prior Publication Data
US 2022/0384472 A1 Dec. 1, 2022

(30) Foreign Application Priority Data
May 27, 2021 (KR) .......................... 10-2021-0068434

(51) Int. Cl.
*H10B 41/60* (2023.01)
*H10B 41/44* (2023.01)
*H10B 41/47* (2023.01)
*H10B 41/48* (2023.01)

(52) U.S. Cl.
CPC ............ *H10B 41/60* (2023.02); *H10B 41/44* (2023.02); *H10B 41/47* (2023.02); *H10B 41/48* (2023.02)

(58) Field of Classification Search
CPC ........ H10B 41/10; H10B 41/44; H10B 41/47; H10B 41/48; H10B 41/60; H10B 41/30; H10B 41/70; H01L 29/42328; H01L 29/788
See application file for complete search history.

(56) References Cited

U.S. PATENT DOCUMENTS

| | | |
|---|---|---|
| 7,652,917 B2 | 1/2010 | Oka et al. |
| 8,378,407 B2 | 2/2013 | Audzeyeu et al. |
| 8,472,251 B2 | 6/2013 | Lee et al. |
| 9,406,382 B2 | 8/2016 | Kim |

(Continued)

FOREIGN PATENT DOCUMENTS

KR 10-2017-0086178 A 7/2017

OTHER PUBLICATIONS

Korean Office Action dated May 20, 2022, in counterpart Korean Patent Application No. 10-2021-0068434 (6 pages in Korean).

*Primary Examiner* — Nicholas J Tobergte
*Assistant Examiner* — Kevin Quinto
(74) *Attorney, Agent, or Firm* — NSIP Law

(57) ABSTRACT

A semiconductor device includes a single poly non-volatile memory device including a sensing and selection gate structure, an erase gate structure, and a control gate structure. The sensing and selection gate structure includes a sensing gate and a selection gate, a bit line, a word line disposed on the selection gate, and a tunneling gate line. The erase gate structure includes an erase gate, and an erase gate line disposed near the erase gate. The control gate structure includes a control gate disposed on the substrate, and a control gate line disposed near the control gate. The sensing gate, the selection gate, the erase gate and the control gate are connected by one conductive layer. The erase gate structure implements a PMOS capacitor, an NMOS transistor, or a PMOS transistor. The semiconductor device includes a single poly non-volatile memory device including a separate program area and erase area.

16 Claims, 9 Drawing Sheets

(56) References Cited

U.S. PATENT DOCUMENTS

| | | |
|---|---|---|
| 10,236,297 B2 | 3/2019 | Kim et al. |
| 10,867,677 B2 | 12/2020 | Kim et al. |
| 2007/0296020 A1* | 12/2007 | Shiba .................. H10B 41/40 |
| | | 257/315 |

* cited by examiner

SEMICONDUCTOR DEVICE WITH SINGLE POLY NON-VOLATILE MEMORY DEVICE AND MANUFACTURING METHOD

CROSS-REFERENCE TO RELATED APPLICATION(S)

This application claims the benefit under 35 U.S.C. § 119 of Korean Patent Application No. 10-2021-0068434 filed on May 27, 2021, in the Korean Intellectual Property Office, the entire disclosure of which is incorporated herein by reference for all purposes.

BACKGROUND

1. Field

The following description relates to a semiconductor device including single poly non-volatile memory device and a manufacturing method.

2. Description of Related Art

A Non-Volatile Memory device (NVD) is a device that allows data to be stably stored for an extended period without utilizing power. Among NVDs, an Electrically Erasable and Programmable Read Only Memory (EEPROM) may electrically erase data stored therein, and re-writing or re-programming the data. Thus, a non-volatile memory device may be used in application fields where there is desire to re-writing a programming, and it may program or erase data by electrically changing a charge of a device that includes a chip. Since a non-volatile memory device may code or decode data electrically, and may perform reprogramming of the data within a system, non-volatile memories may be implemented in application fields where a user may desire to change information.

Normally, a memory unit (EEPROM) that may program and erase data may use a double poly structure using two deposited polys, or a single poly structure using one poly.

Typically, since an area where data is programmed and erased data is the same, when a cycle is repeated, an oxide may be degraded, thus resulting in a decrease in endurance.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a semiconductor device includes a sensing and selection gate structure; an erase gate structure; and a control gate structure, wherein the sensing and selection gate structure comprises: a sensing gate and a selection gate each disposed on a substrate; a bit line (BL) disposed adjacent to the sensing gate; a word line (WL) disposed on the selection gate; and a tunneling gate line (TG line) disposed adjacent to the selection gate, wherein the erase gate structure comprises: an erase gate disposed on the substrate; and an erase gate line (EG line) disposed adjacent to the erase gate, wherein the control gate structure comprises: a control gate disposed on the substrate; and a control gate line (CG line) disposed adjacent to the control gate, wherein the sensing gate, the selection gate, the erase gate and the control gate are connected by a conductive layer, and wherein the erase gate structure implements one of a PMOS capacitor, an NMOS transistor, or a PMOS transistor.

The semiconductor device may include a deep N-type well area (DNW) disposed in the substrate; a first P-type well area (PW), a second P-type well area (PW), and a third P-type well area (PW) spaced apart from each other, and disposed in the deep N-type well area (DNW); a shallow trench isolation structure disposed between the first P-type well area (PW) and the second P-type well area; and an N-type well area disposed under the shallow trench isolation structure.

The semiconductor device may further include applying a positive operation voltage (+VPP) in the erase gate (EG) and the control gate line (CG line), and applying a negative operation voltage (−VPP) in the tunneling gate line (TG) during execution of a program operation, and applying a negative operation voltage (−VPP) in the tunneling gate line (TG line) and the control gate line, and applying a positive operation voltage (+VPP) in the erase gate (EG) during execution of an erase operation.

A structure of the PMOS capacitor may include a P-type well area (PW) disposed in the substrate; a first high concentration P-type doping area (P+) and a second high concentration P-type doping area (P+) configured to be spaced apart from each other, and disposed in the P-type well area (PW); and wherein the erase gate is disposed between the first high concentration P-type doping area (P+) and the second high concentration P-type doping area (P+).

The second high concentration P-type doping area (P+) may be disposed at a distance that is further from the erase gate in comparison with the first high concentration P-type doping area (P+).

The NMOS transistor structure may include a P-type well area (PW) formed in the substrate; a first high concentration N-type doping area (N+) and a second high concentration N-type doping area (N+) spaced apart from each other, and disposed in the P-type well area (PW); a high concentration P-type doping area (P+) configured to be adjoined to the second high concentration N-type doping area; and wherein the erase gate may be disposed between the first high concentration N-type doping area (N+) and the second high concentration N-type doping area (N+).

The control gate structure may further include a P-type well area formed in the substrate; a first high concentration P-type doping area (P+) and a second high concentration P-type doping area (P+) disposed in the P-type well area; and an implant area disposed between the first high concentration P-type doping area (P+) and the second P-type doping area, and configured to have a same conductivity type as the first high concentration P-type doping area (P+) and the second high concentration P-type doping area.

An area of the control gate may be greater than an area of the erase gate.

The PMOS transistor structure may include an N-type well area (NW) formed in the substrate; a first high concentration P-type doping area (P+) and a second high concentration P-type doping area (P+) spaced apart from each other, and disposed in the N-type well area (NW); a high concentration N-type doping area (N+) configured to be adjoined to the second high concentration P-type doping area; and wherein the erase gate is disposed between the first high concentration P-type doping area (P+) and the second high concentration P-type doping area (P+).

The semiconductor device my further include a sensing gate insulating layer, an erase gate insulating layer, and a control gate insulating layer which are respectively placed under the sensing gate, the erase gate, and the control gate, wherein a thickness of the sensing gate insulating layer is the same as or thinner than a thickness of the control gate insulating layer.

In a general aspect, a semiconductor device includes a single poly non-volatile memory device, including a sensing and selection gate structure, including a selection gate and a sensing gate, wherein the sensing gate is configured to perform a data programming operation; an erase gate structure, including an erase gate configured to perform a data erase operation; and a control gate structure, including a control gate which is configured to be connected to the erase gate and the sensing gate.

The erase gate structure may be one of a P-type MOS capacitor, an N-type MOS transistor, and a P-type MOS transistor.

An area of the control gate may be larger than an area of the erase gate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
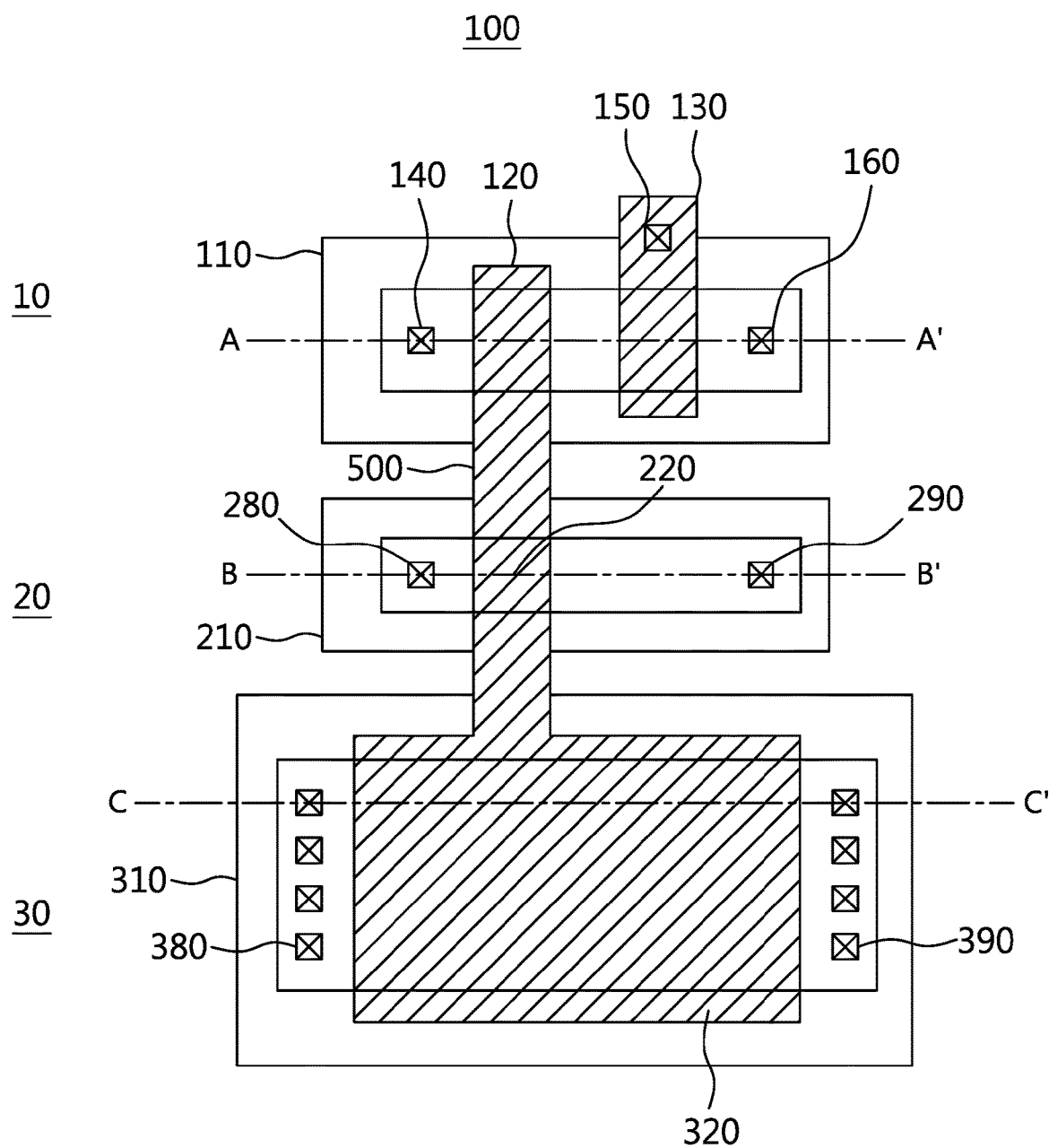
FIG. 1 is an example plan view of an example semiconductor device including single poly non-volatile memory device, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of the application, may be omitted for increased clarity and conciseness.

Throughout the specification, when an element, such as a layer, area, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, areas, layers, or sections, these members, components, areas, layers, or sections are not to be limited by these terms. Rather, these terms are only used to distinguish one member, component, area, layer, or section from another member, component, area, layer, or section. Thus, a first member, component, area, layer, or section referred to in examples described herein may also be referred to as a second member, component, area, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include varies in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The features of the examples described herein may be combined in various ways, as will be apparent after an understanding of the disclosure of this application. Further, although the examples described herein have a variety of configurations, other configurations are possible, as will be apparent after an understanding of the disclosure of this application.

One or more non-limiting examples relate to an example semiconductor device including a single poly non-volatile memory device and a manufacturing method thereof. However, the disclosure is not limited by the disclosed examples.

One or more examples relate to an example semiconductor device including a single poly non-volatile memory device that addresses the typical above-identified problems. By separately implementing an area to erase data, and improving a degradation of oxide according to a cycle, the one or more examples may improve not only endurance, but also data retention.

One or more examples relate to a semiconductor device including a single poly non-volatile memory device and a manufacturing method that enhances endurance characteristics through improvement of degradation resulting from multiple cycling operations, by separately implementing a data program area and a data erase area.

One or more examples relate to a single poly non-volatile device that implements one poly. A single poly non-volatile device of one or more examples may be composed by applying a positive operating voltage ($+V_{PP}$) and a negative operating voltage ($-V_{PP}$) in an erase operation or a program operation, without an extra procedure with a high voltage or a high voltage device. Thus, without implementing an extra procedure with a high voltage or a high voltage device, by changing a medium voltage device into a semiconductor device including a single poly non-volatile memory device, and implementing a circuit with a medium voltage device, it is compatible with a logic process. Accordingly, the stages of the procedure may be reduced, a cost may be reduced, and a time of production may be shortened.

FIG. 1 is an example plan view of an example semiconductor device including a single poly non-volatile memory device, in accordance with one or more embodiments.

Referring to FIG. 1, an example semiconductor device, including a single poly non-volatile memory device (Single poly NVM, 100), may represent a unit cell, and an example semiconductor device, including a single poly non-volatile memory device (Single poly NVM, 100), may include a sensing and selection gate structure 10, an erase gate structure 20, and a control gate structure 30. Herein, a selection gate structure 10 may select or unselect a unit cell.

A sensing and selection gate structure 10 may include a first P-type well area (hereafter, PW, 110) formed in a substrate, a sensing gate 120 formed on the first PW 110, a selection gate 130, a bit line (hereafter, BL, 140), a word line (hereafter, WL, 150) and a tunneling gate line (hereafter, TG line, 160).

An erase gate structure 20 may include a second P-type well area (hereafter, PW, 210) formed in a substrate, an erase gate (hereafter, EG, 220) formed on the second PW 210, and a first and a second erase gate line (hereafter, EG line 280, 290).

A control gate structure 30 may include a third P-type well area (hereafter, PW, 310) formed in a substrate, a control gate (hereafter, CG, 320) formed on the third PW 310, and a first and a second control gate line (hereafter, CG line 380, 390).

In one or more examples, in an example semiconductor device including a single poly non-volatile memory device (Single poly NVM, 100), a sensing gate 120, EG 220, and CG 320 may be connected to each other as a single poly (or it may be referred to as a floating gate, 500). That is why it is referred to as a semiconductor device including single poly non-volatile memory device (Single poly NVM, 100). A single poly (or it may be referred to as a floating gate, 500) may be formed by, as a non-limiting example, a poly-silicon material, and it may be regarded as a long conductive layer that is formed in an up to down direction. Therefore, a single poly 500 may be divided into a sensing gate 120, EG 220, and CG 320. A single poly 500 may be formed by going through a first, a second, and a third PW 110, 210, 310. A charge may be charged or discharged to a single poly 500, based on a voltage applied to a WL 150, a TG line 160, and a first and a second CG line 380, 390.

Accordingly, an example semiconductor device including a single poly non-volatile memory device (Single poly NVM, 100) may have an improved structure compared to a typical double poly structure to a single poly structure that implements one poly. Therefore, an added mask and stages of procedure may be simplified. That is, an example semiconductor device including a single poly non-volatile memory device (Single poly NVM, 100) may reduce production costs and production time. A semiconductor device including a single poly non-volatile memory device (Single poly NVM, 100) of one or more examples may be transformed from a medium voltage device of basic logic process, to produce a semiconductor chip, and may be compatible with a logic process.

To improve endurance characteristics, in one or more examples, an erase gate structure 20 may be added to an example semiconductor device including a single poly non-volatile memory device (Single poly NVM, 100). Accordingly, endurance characteristics may be raised up to 1M cycle maximally. In one or more examples, an erase gate structure 20 may be a P-type MOS capacitor, an N-type MOS transistor, or a P-type MOS transistor. This is beneficial in separating a program area and an erase area.

Table 1 below, relates to a program/erase operating voltage. In a sensing gate 120, an electron may be implanted to a floating gate 500 and programed, and an electron may be released in an erase gate (EG, 220) and an erase operation may be executed.

In a program operation, a positive operating voltage (+VPP), as a non-limiting example, +8V, may be applied to an EG 220 and a CG line 390. A negative operating voltage (-VPP), as a non-limiting example, -8V, may be applied to a TG line 160. Then, an electron may be implanted to a sensing gate 120, thus raising the voltage of the single poly NVM 100. Herein, a VPP indicates a program/erase operating voltage, which may simply be called an operating voltage.

In an erase operation, a negative operating voltage (−VPP) may be applied to a TG line 160 and a CG line 390, and a positive operating voltage (+VPP) may be applied to an EG. Then, an electron in a floating gate 500 may escape to an EG 200, thus lowering the voltage of the single poly NVM.

A program operation may be executed based on a sensing gate 120, and an erase operation may be executed based on an erase gate (EG) 220. Typically, where a program operation and an erase operation are all based, or performed, on a sensing gate 120, a program operation and an erase operation may be repeated in one sensing gate insulating layer, and a degradation of a gate insulating layer may be accelerated.

On the other hand, in one or more examples, since a program area and an erase area may be separated, a sensing gate insulating layer and an erase gate insulating layer may take charge of, or control, a program operation and an erase operation respectively. Thus, a degradation of a sensing gate insulating layer and an erase gate insulating layer may be diminished.

TABLE 1

Program-Erase Operating Voltage

|  | TG | EG | CG |
|---|---|---|---|
| Program | −8 V | 8 V | 8 V |
| Erase | −8 V | 8 V | −8 V |

In one or more examples, a sensing gate 120 may be embodied as a tunneling area that provides a moving path of an electron toward a lower end thereof. More specifically, a sensing gate 120 may be tunneled according to a voltage difference of a TG line 160, a WL 150, and a CG line 380.

A selection gate 130 may be connected with a WL 150. In one or more examples, a selection gate 130 may block a flowing of a leakage current in a state of over erase.

In one or more examples, an EG 220 may be embodied as a tunneling area to provide a moving path of an electron toward the lower end thereof. More specifically, an EG 220 may be tunneled according to a voltage difference between a WL 150, a TG line 160, and a CG line 380.

In one or more examples, a CG 320 may be electrically and physically connected with a sensing gate 120 through an EG 220. More specifically, a CG 320 may be connected with a sensing gate 120 through a single poly 500 that is formed in a same plane. An area of CG 320 may be relatively larger than an area of EG 220 or an area of FG 500, and may increase a coupling ratio. A coupling ratio may be determined as a capacitance ratio of a floating gate (FG) 500 and a CG 320, and when an area of a CG 320 is enlarged, a coupling ratio is increased. Hence, a voltage applied to a CG 320 may be mostly delivered to a floating gate (FG) 500. In an example, when a coupling ratio is 90% and 15V is applied to a CG, a voltage delivered to a FG may be 15×0.9=13.5V.

Figure 2:
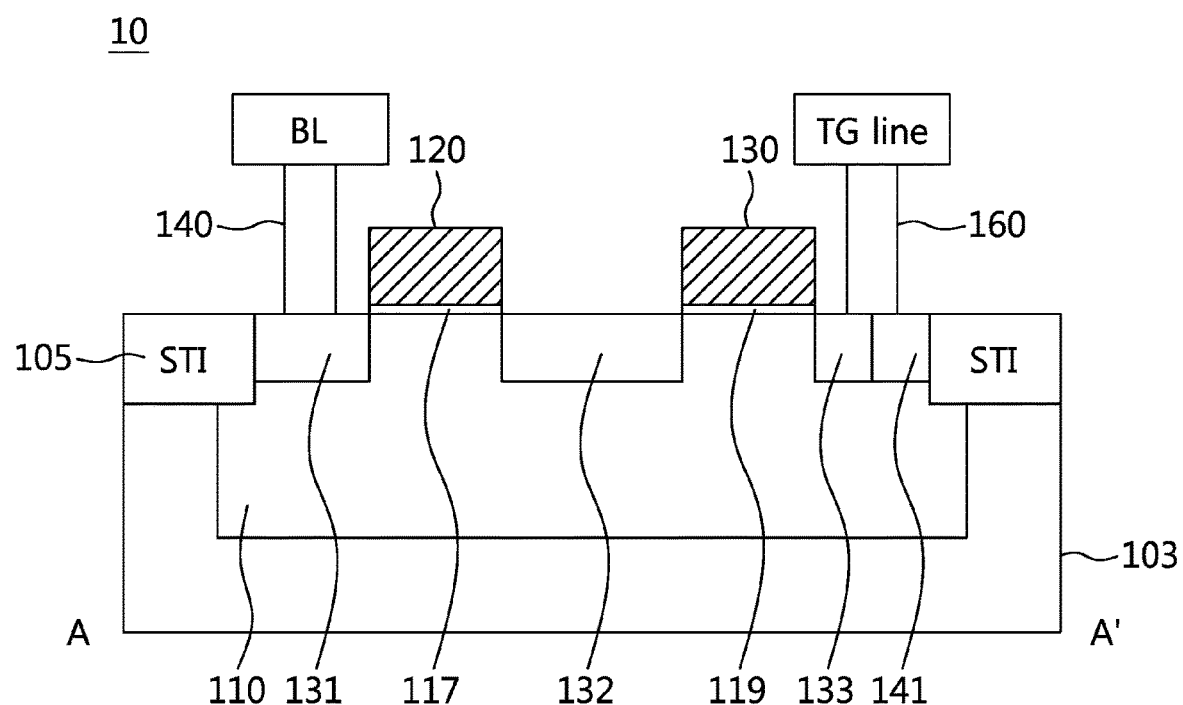
FIG. 2 is an example cross-sectional view along line A-A' of FIG. 1, and illustrates an example cross-sectional view of an example semiconductor device including single poly non-volatile memory device, in accordance with one or more embodiments.

FIG. 2 is an example cross-sectional view along line A-A' of FIG. 1, and illustrates an example cross-sectional view of an example semiconductor device including a single poly non-volatile memory device, in accordance with one or more embodiments.

Referring to FIG. 2, a sensing and selection gate structure 10, in accordance with one or more embodiments, may include a shallow trench isolation (STI) structure formed in a substrate (hereafter, STI, 105), a first PW 110, a gate insulating layer (117, 119), a sensing gate 120, a selection gate 130, a first, a second, and a third high concentration N-type doping area (hereafter, N+, 131, 132, 133), a high concentration P-type doping area (hereafter, P+, 141), a BL 140 connected with an N+131, and a TG line 160 connected with an N+133 and a P+141. A TG line 160 may deliver an electrical voltage to execute a program-erase operation.

In one or more examples, an N+131 may be a drain area of a sensing gate 120, and an N+132 may be a source area of a sensing gate 120. Simultaneously, an N+132 may be a drain area of a selection gate 130. N+133 may be a source area of a selection gate 133. In a semiconductor device including a single poly non-volatile memory device (Single poly NVM, 100), an N+133 and a P+141 may be disposed to be adjoined in one active area. Thus, an area of a semiconductor device including a single poly non-volatile memory device (Single poly NVM, 100) may be reduced.

In one or more examples, a sensing gate insulating layer 117 may be formed with a specific thickness to create a tunneling. In one or more examples, a selection gate insulating layer 119 may be embodied with a same thickness of a sensing gate insulating layer 117, but it is not limited thereto.

In one or more examples, rather than placing a sensing gate 120 near a TG line 160, the sensing gate 120 may be spaced apart from a TG line 160. This placement may increase an erasing efficiency, and may improve an operation margin. Herein, an operation margin may be a difference between a program voltage and an erase voltage. In a semiconductor device including a single poly non-volatile memory device (Single poly NVM, 100), the larger an operation margin is, the larger a number of data programming and data erasing operations may be.

Figure 3:
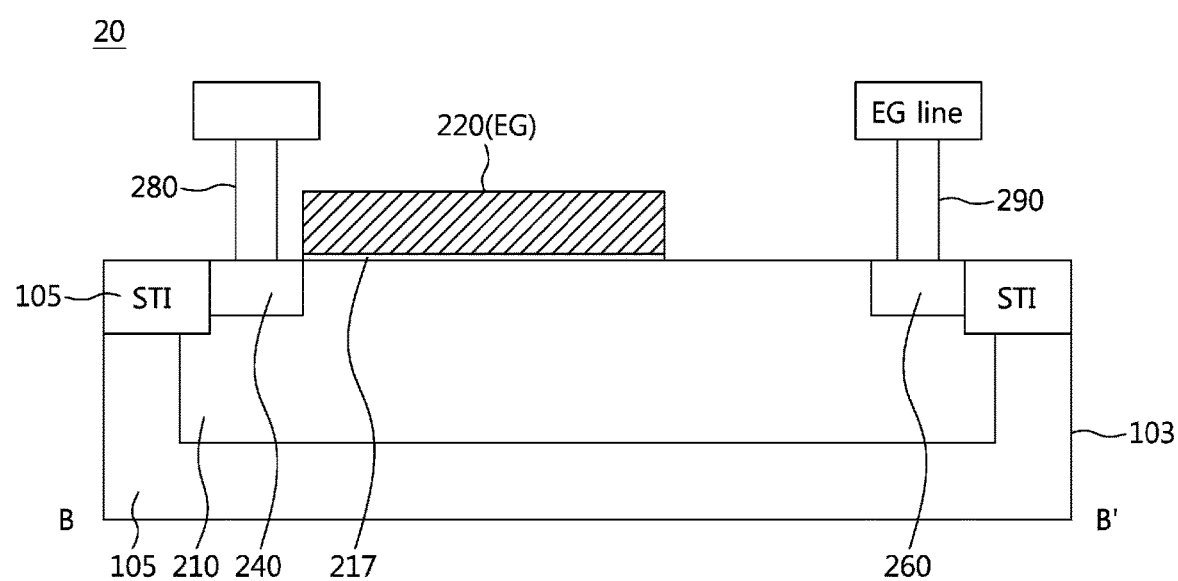
FIG. 3 is an example cross-sectional view along line B-B' of FIG. 1, and illustrates an example cross-sectional view of an example semiconductor device including single poly non-volatile memory device, in accordance with one or more embodiments.

FIG. 3 is an example cross-sectional view along line B-B' of FIG. 1, and illustrates an example cross-sectional view of an example semiconductor device including a single poly non-volatile memory device, in accordance with one or more embodiments.

To improve endurance characteristics, in one or more examples, a programming area and an erasing area may be separated by adding one erase gate structure 20 inside a cell. Accordingly, a degradation of a gate insulating layer based on a cycling operation, may be improved. Thus, endurance characteristics may be raised up to 1M cycle maximally. In one or more examples, one erase gate structure 20 may be a P-type MOS capacitor, an N-type MOS transistor, or a P-type MOS transistor.

Referring to FIG. 3, an erase gate structure 20, in accordance with one or more embodiments, may include a second PW 210 formed in a substrate, an EG 220, a first and a second P+(240, 260), an erase gate insulating layer 217, a first and a second EG line (280, 290) connected with a first and a second P+(240, 260). In FIG. 3, an erase gate structure 20 illustrates a P-type MOS transistor structure. A second P+260 may be formed further apart from an erase gate (EG, 220) than a first P+240 that increases a resistance between the second P+260 and the erase gate (EG, 220).

Figure 4:
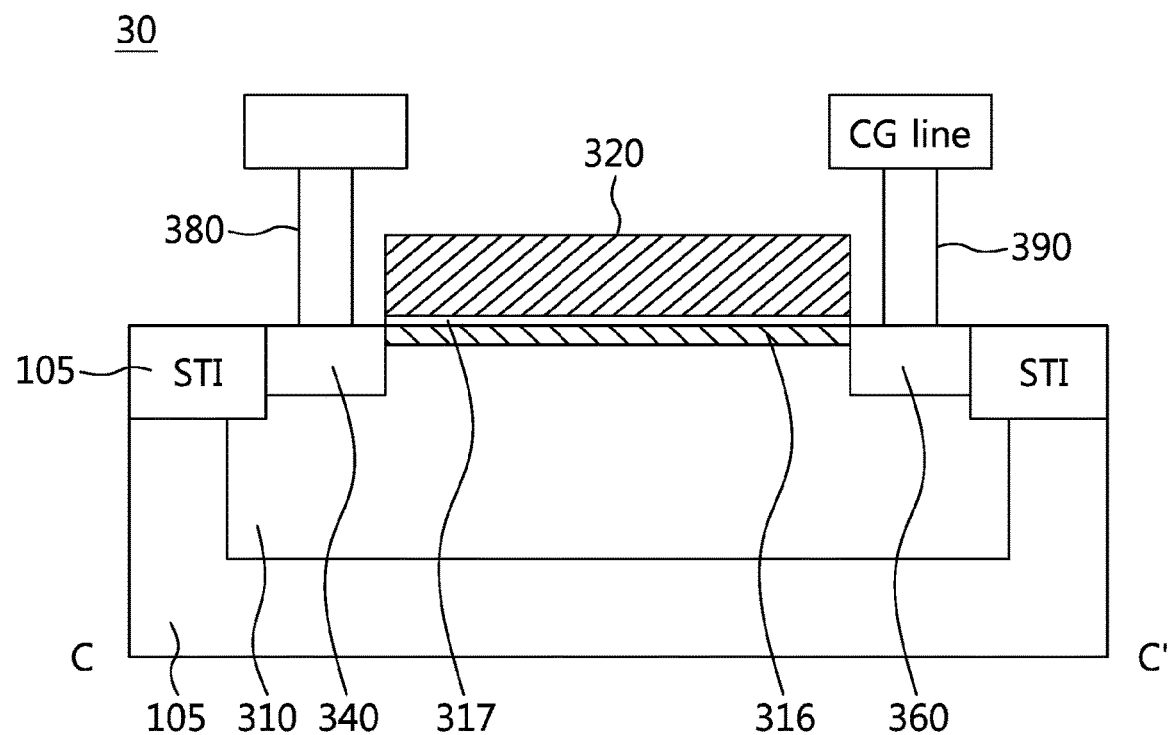
FIG. 4 is an example cross-sectional view along line C-C' of FIG. 1, and illustrates an example cross-sectional view of an example semiconductor device including single poly non-volatile memory device, in accordance with one or more embodiments.

FIG. 4 is an example cross-sectional view along line C-C' of FIG. 1, and illustrates an example cross-sectional view of an example semiconductor device including a single poly non-volatile memory device, in accordance with one or more embodiments.

Referring to FIG. 4, a control gate structure 30, in accordance with one or more embodiments, may include a third PW 310, an implant area 316, a control gate insulating layer 317, a CG 320, a first and a second P+(340, 360), a first and a second CG line (380,390). In FIG. 4, a control gate structure 30 illustrates a P-type MOS capacitor structure. As described earlier, an erase gate structure 20 may be an N-type MOS transistor or a P-type MOS transistor instead of a P-type MOS capacitor. If a P-type MOS capacitor structure is used as an erase gate structure 20, in one or more examples, an erase gate structure 20 and a control gate structure 30 may have a P-type MOS capacitor structure. In such an example, this structure may be beneficial in terms of efficiency of a procedure.

In one or more examples, an implant area 316 may be disposed along a side of CG 320, or may be disposed in a spaced-apart manner in a lower end of CG 320. In one or more examples, an implant area 316 may be placed in an upper end of a third PW 310, may improve an operation margin of a CG 320, and may increase a number of operations pertaining to the programming and erasing of data. A control gate insulating layer 317 may be formed between a CG 320 and an implant area 316, or it may be placed between a first and a second P+(340, 360). A control gate insulating layer 317 may be formed with a same thickness of an erase gate insulating layer 217, or may be formed to be thicker than a thickness of the erase gate insulating layer 217. A control gate insulating layer 317 may be formed to be thicker than a sensing gate insulating layer 117. In order to make a tunneling process easy, it may be desirable to form a sensing gate insulating layer 117 to be relatively thinner than the control gate insulating layer 317, or with a same thickness.

In one or more non-limiting examples, an implant area 316 may be formed by implanting boron (B+) of 1.0E11-1.0E13 atoms/cm$^2$ with 5-40KeV energy and implanting indium (In+) of 1.0E11-1.0E13 atoms/cm$^2$ with 200-400KeV energy. Thus, an implant area 316 may have the same conductivity type as a first and a second P+(340, 360).

Figure 5:
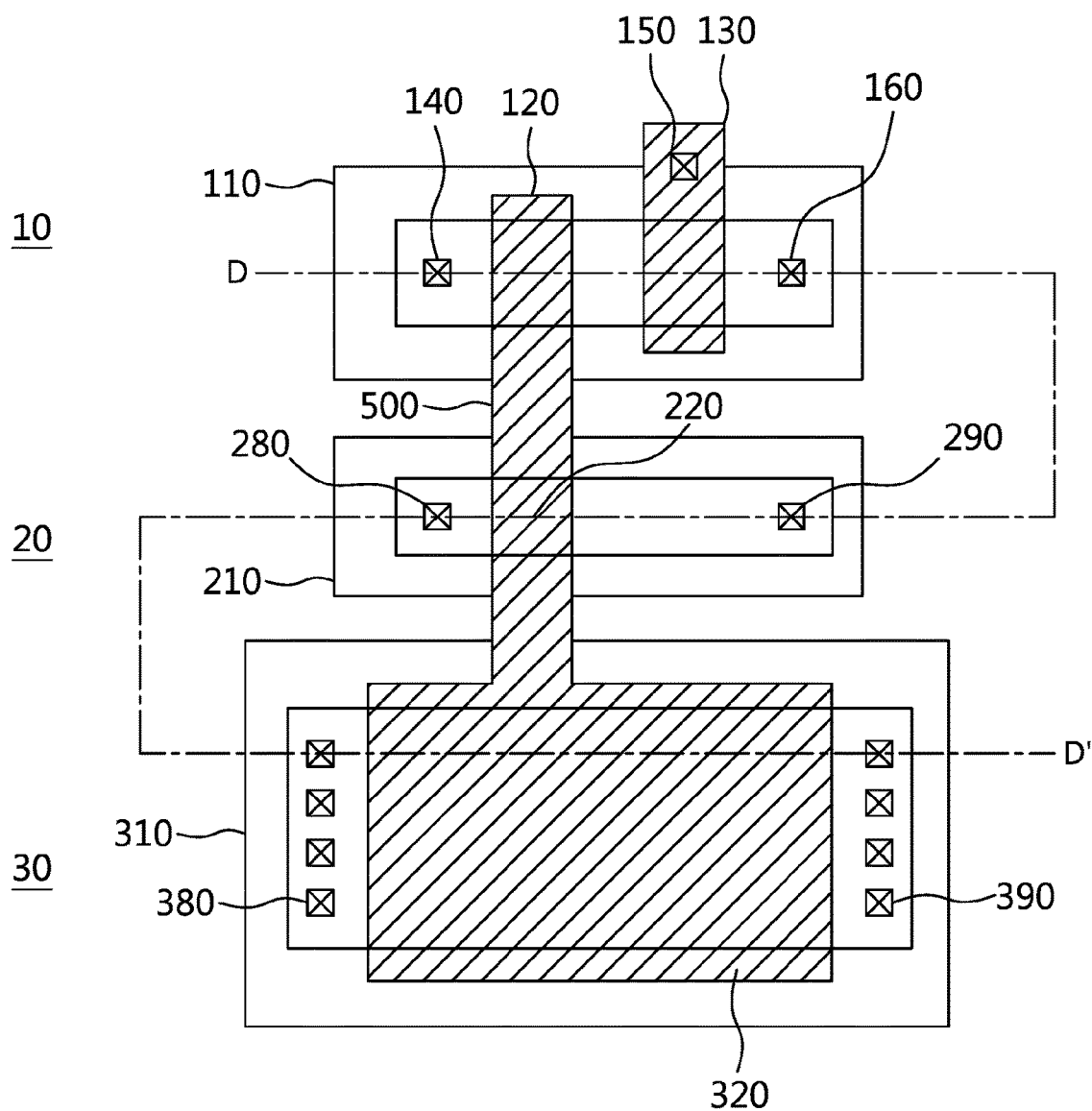
FIG. 5 is an example plan view of an example semiconductor device including single poly non-volatile memory device, in accordance with one or more embodiments.

FIG. 5 is an example plan view of an example semiconductor device including a single poly non-volatile memory device, in accordance with one or more embodiments.

FIG. 5 may have the same structure as FIG. 1, so detailed description is omitted herein. A cross-sectional view that is cut along line D-D' is illustrated in FIG. 6.

Figure 6:
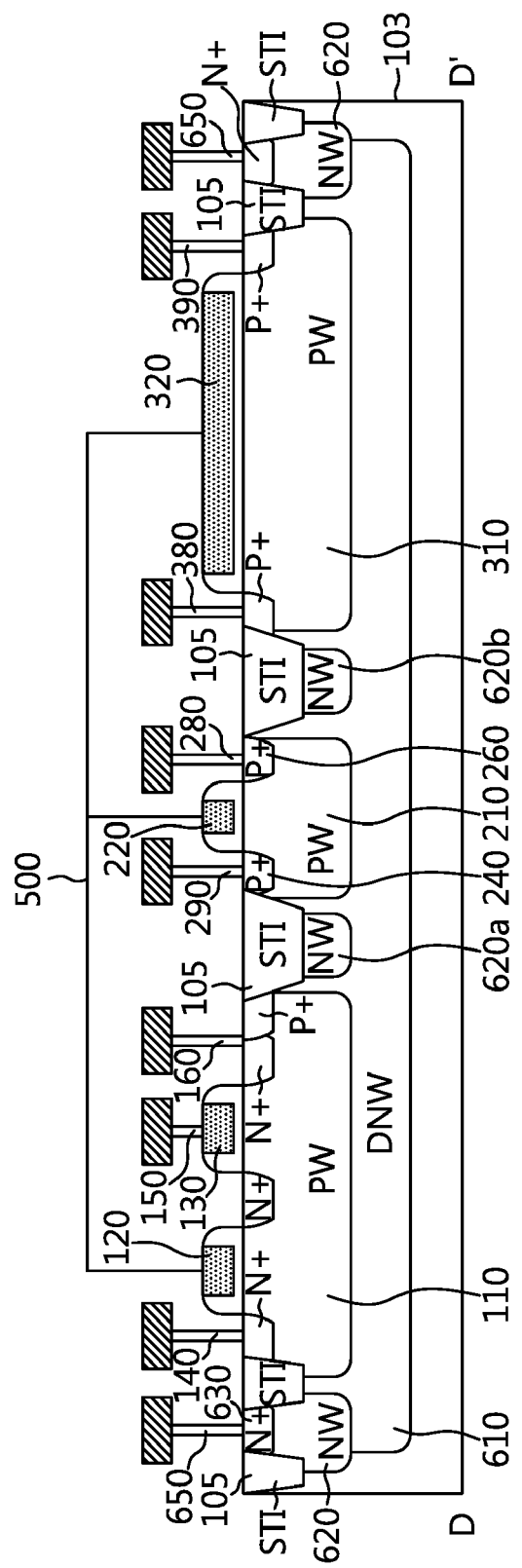
FIG. 6 is an example cross-sectional view that is cut along line D-D' of FIG. 5, illustrates an example cross-sectional view of an example semiconductor device including single poly non-volatile memory device, in accordance with one or more embodiments.

FIG. 6 is an example cross-sectional view that is cut along line D-D' of FIG. 5. FIG. 6 is an example cross-sectional view of an example semiconductor device including a single poly non-volatile memory device, in accordance with one or more embodiments.

FIG. 6 illustrates an example in which an added erase gate structure 20 is a PMOS capacitor. An example semiconductor device including a single poly non-volatile memory device (Single poly NVM, 100) may be a combination of a sensing and selection gate structure 10, an erase gate structure 20 and a control gate structure 30 as described above. Thus, elements disclosed in FIG. 2, FIG. 3, and FIG. 4 may be omitted herein.

Referring to FIG. 6, a PMOS capacitor structure may include a second P-type well area (PW, 210) formed in a substrate, a first and a second high concentration P-type doping area (P+, 240, 260) formed, and spaced from each other, in a second PW 210, and an erase gate 220 formed between the first and a second high concentration P-type doping area (P+). Herein, an erase gate 220 may be a gate electrode with N-type doping or with P-type doping. Since a PMOS capacitor is illustrated, the PMOS capacitor structure may include a gate electrode 220 with P-type doping.

Still referring to FIG. 6, a deep N-type well area 610 (hereafter, DNW) may be formed in a P-type substrate 103. To give a bias to the DNW 610, a structure combining an N-type well area 620 (hereafter, NW), N+630, and a contact plug 650 may be added in opposite sides of a DNW 610.

Moreover, a shallow trench isolation structure (STI, 105) and a first NW 620a may be added to make an isolation of an electrode between a sensing and a selection gate 20 and an erase gate structure 30. Likewise, a shallow trench isolation structure (STI, 105) and a second NW 620b may be added to make an isolation of an electrode between an erase gate structure 30 and a control gate structure 40.

In FIG. 6, a horizontal length of a third PW 310 may be formed, or disposed, to be longer than a horizontal length of a first PW 110 or a second PW 210. That is, an area of a third PW 310 may be formed to be larger than an area of a first PW 110 or a second PW 210 to increase a coupling ratio. As disclosed above, to increase a coupling ratio, a horizontal length or width of a CG 320 may be formed to be larger than a horizontal length or width of sensing gate 120, selection gate 130, and erase gate (EG) 220. Likewise, the longer a horizontal length of a CG 320 is, the bigger a width of a third PW 310 is.

Figure 7:
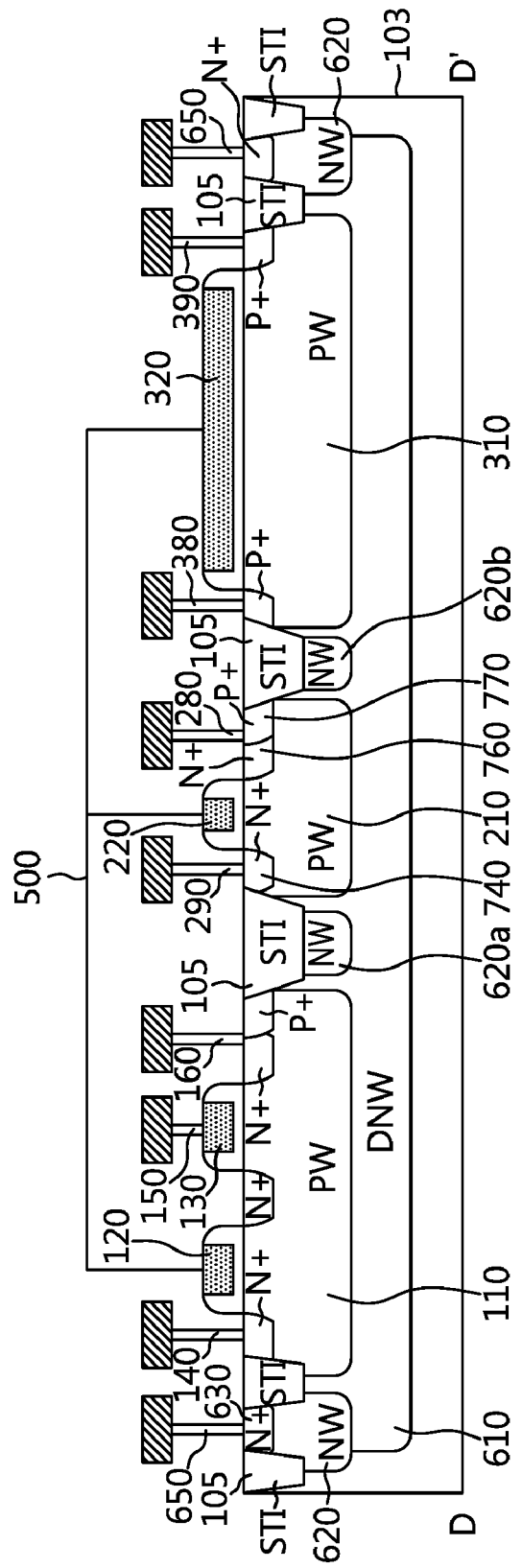
FIG. 7 is an example cross-sectional view that is cut along D-D' of FIG. 5, and illustrates an example cross-sectional view of an example semiconductor device including single poly non-volatile memory device, in accordance with one or more embodiments.

FIG. 7 is an example cross-sectional view that is cut along line D-D' of FIG. 5. FIG. 7 illustrates an example cross-sectional view of an example semiconductor device including single poly non-volatile memory device according to another embodiment of the disclosure.

FIG. 7 illustrates an example in which an added erase gate structure 20 is an NMOS transistor. Thus, in an erase gate structure 30, a first and a second N+(740, 760), an EG 220, and additionally, a P+770 may be formed in a second PW 210.

An NMOS transistor structure may be a semiconductor device including a second P-type well area (PW) 210 formed in a substrate; a first and a second high concentration N-type doping area (N+, 740, 760) formed and spaced from each other in the second PW 210; a high concentration P-type doping area (P+, 770) formed to be adjoined to the second high concentration N-type doping area; and the erase gate 220 formed between the first and the second high concentration N-type doping area (N+, 740, 760). An erase gate 220 may be a gate electrode with N-type doping or with P-type doping. Because it is an NMOS transistor, a gate electrode 220 with N-type doping may be preferred.

Figure 8:
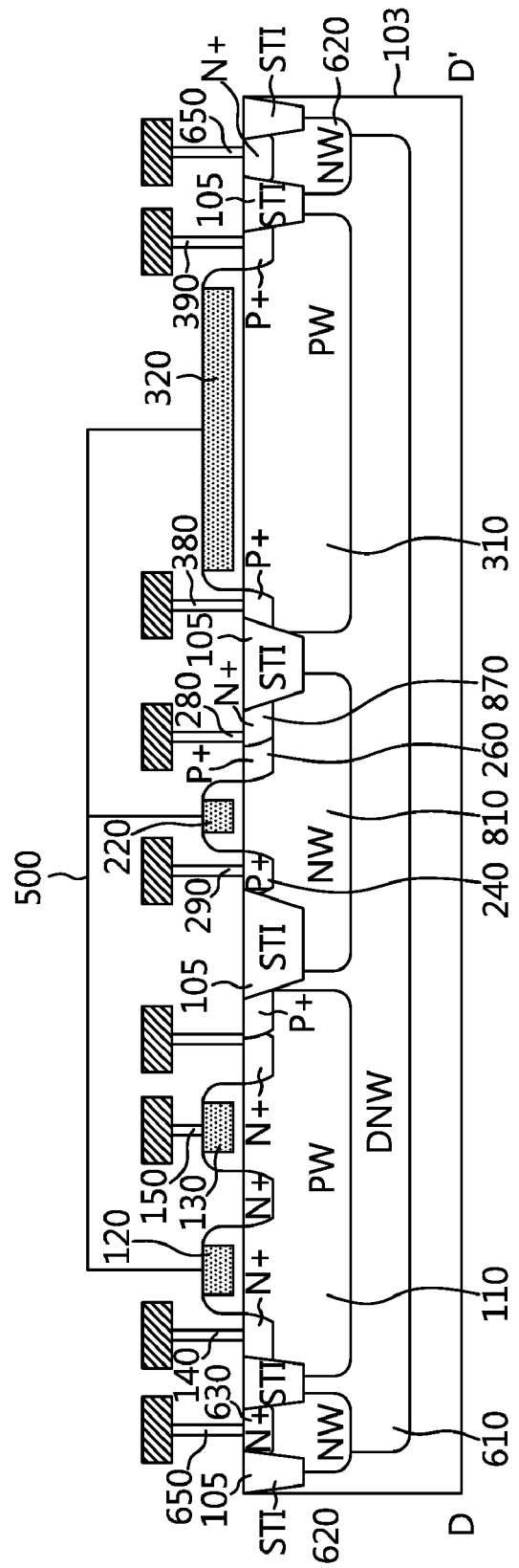
FIG. 8 is an example cross-sectional view that is cut along D-D' of FIG. 5, and illustrates an example cross-sectional view of an example semiconductor device including single poly non-volatile memory device, in accordance with one or more embodiments.

FIG. 8 is an example cross-sectional view that is cut along line D-D' of FIG. 5. FIG. 8 illustrates an example cross-sectional view of an example semiconductor device including a single poly non-volatile memory device, in accordance with one or more embodiments.

FIG. 8 illustrates an example in which an added erase gate structure 20 is a PMOS transistor. Thus, in an erase gate structure 30, a first and a second P+(240, 260), an EG 220, and additionally, an N+870 are formed in an NW 810. When an erase gate structure 20 is a PMOS transistor, NW 620a and 620b structures as illustrated in FIG. 6 or FIG. 7 may not be necessary. Accordingly, it may be beneficial in reducing a size of a chip. NW 620a and 620b structures may be included between an adjoined first, a second, and a third PW (110, 210, 310) in FIG. 6 or FIG. 7. In FIG. 8, when a second PW 210 is replaced with an NW 810, NW 620a and 620b structures between a first, a second, and a third PW (110, 210, 310) may not be necessary.

In an example, the PMOS transistor structure may be an example semiconductor device including an N-type well area (NW) formed in the substrate; a first and second high concentration P-type doping area (P+, 240, 260) formed and spaced from each other in the NW; a high concentration N-type doping area (N+, 870) formed to be adjoined to the second high concentration P-type doping area; and the erase gate 220 formed between the first and second high concentration P-type doping area (P+, 240, 260). An erase gate 220 may be a gate electrode with N-type doping or with P-type doping. Since it is a PMOS transistor, a gate electrode 220 with P-type doping may be beneficial.

Figure 9:
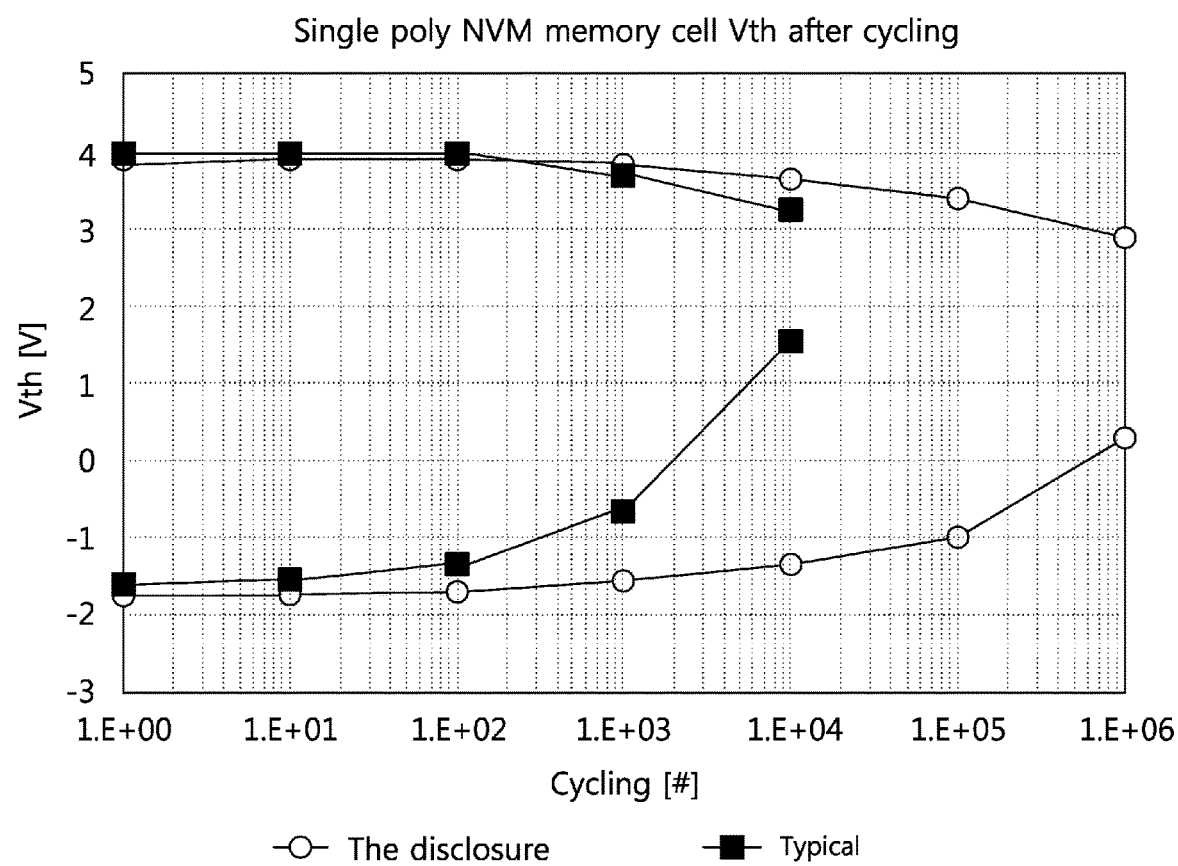
FIG. 9 is a graph describing a program voltage and an erase voltage according to a number of cycling of an example semiconductor device including single poly non-volatile memory device, and a typical semiconductor device including single poly non-volatile memory device, in accordance with one or more embodiments.

FIG. 9 is a graph describing an example program voltage and erase voltage according to a number of cycling of an example semiconductor device of one or more examples including a single poly non-volatile memory device, and a typical semiconductor device including a single poly non-volatile memory device.

Specifically, in FIG. 9, a typical semiconductor device may not operate if the number of cycles exceeds 10,000 cycles, so that endurance characteristics may fail at 10,000 cycles.

On the other hand, in one or more examples, since a program threshold voltage and an erase threshold voltage may not change even if a number of cycles exceeds 10,000 cycles, saved data may be securely maintained. In one or more examples, in a semiconductor device including a single poly non-volatile memory device (Single poly NVM, 100), a cycle may operate over 10,000 cycles, even 1,000,000 cycles. Accordingly, endurance characteristics may be achieved for 1,000,000 cycles.

That is, in an example semiconductor device including a single poly non-volatile memory device (Single poly NVM, 100), that implements a separate program area and a separate erase area, a degradation of oxide may be improved, furthermore, not only an endurance of a device but a data retention capacity may be improved.

The disclosure has described one or more examples. However, a scope of the one or more examples is not limited thereto.

According to one or more examples, an example semiconductor device may include a single poly non-volatile memory device which may implement a separate program area and a separate erase area. This may improve a degradation of an oxide caused by cycling, may improve endurance of a device, and may improve data retention capacity.

Additionally, an example semiconductor device including a single poly non-volatile memory device may improve efficiency of data programming and data erasing, and may reduce a size of a memory device.

While this disclosure includes specific examples, it will be apparent after an understanding of the disclosure of this application that various varies in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
   a sensing and selection gate structure;
   an erase gate structure; and
   a control gate structure,
   wherein the sensing and selection gate structure comprises:
      a sensing gate and a selection gate each disposed on a substrate;
      a bit line (BL) disposed adjacent to the sensing gate;
      a word line (WL) disposed on the selection gate; and
      a tunneling gate line (TG line) disposed adjacent to the selection gate,
   wherein the erase gate structure comprises:
      an erase gate disposed on the substrate; and
      an erase gate line (EG line) disposed adjacent to the erase gate,
   wherein the control gate structure comprises:
      a control gate disposed on the substrate; and
      a control gate line (CG line) disposed adjacent to the control gate,
   wherein the sensing and selection gate structure, the erase gate and the control gate are connected by a conductive layer, and
   wherein the erase gate structure implements one of a PMOS capacitor, an NMOS transistor, or a PMOS transistor.

2. The semiconductor device of claim 1, further comprising:
   a deep N-type well area (DNW) disposed in the substrate;
   a first P-type well area (PW), a second P-type well area (PW), and a third P-type well area (PW) spaced apart from each other, and disposed in the deep N-type well area (DNW);
   a shallow trench isolation structure disposed between the first P-type well area (PW) and the second P-type well area; and
   an N-type well area disposed under the shallow trench isolation structure.

3. The semiconductor device of claim 1, further comprising:
   applying a positive operation voltage (+VPP) in the erase gate (EG) and the control gate line (CG line), and applying a negative operation voltage (−VPP) in the tunneling gate line (TG) during execution of a program operation, and
   applying a negative operation voltage (−VPP) in the tunneling gate line (TG line) and the control gate line, and applying a positive operation voltage (+VPP) in the erase gate (EG) during execution of an erase operation.

4. The semiconductor device of claim 1,
   wherein the NMOS transistor structure comprises
      a P-type well area (PW) formed in the substrate;
      a first high concentration N-type doping area (N+) and a second high concentration N-type doping area (N+) spaced apart from each other, and disposed in the P-type well area (PW);
      a high concentration P-type doping area (P+) configured to be adjoined to the second high concentration N-type doping area; and
      wherein the erase gate is disposed between the first high concentration N-type doping area (N+) and the second high concentration N-type doping area (N+).

5. The semiconductor device of claim 1, wherein the control gate structure further comprises:
   a P-type well area formed in the substrate;
   a first high concentration P-type doping area (P+) and a second high concentration P-type doping area (P+) disposed in the P-type well area; and
   an implant area disposed between the first high concentration P-type doping area (P+) and the second P-type doping area, and configured to have a same conductivity type as the first high concentration P-type doping area (P+) and the second high concentration P-type doping area.

6. The semiconductor device of claim 1,
wherein an area of the control gate is greater than an area of the erase gate.

7. The semiconductor device of claim 1,
wherein the PMOS transistor structure comprises
an N-type well area (NW) formed in the substrate;
a first high concentration P-type doping area (P+) and a second high concentration P-type doping area (P+) spaced apart from each other, and disposed in the N-type well area (NW);
a high concentration N-type doping area (N+) configured to be adjoined to the second high concentration P-type doping area; and
wherein the erase gate is disposed between the first high concentration P-type doping area (P+) and the second high concentration P-type doping area (P+).

8. The semiconductor device of claim 1, further comprising:
a sensing gate insulating layer, an erase gate insulating layer, and a control gate insulating layer which are respectively placed under the sensing gate, the erase gate, and the control gate,
wherein a thickness of the sensing gate insulating layer is the same as or thinner than a thickness of the control gate insulating layer.

9. The semiconductor device of claim 1,
wherein the sensing gate is configured to perform a data programming operation and the erase gate is configured to perform a data erase operation.

10. The semiconductor device of claim 1, wherein the erase gate line is a first erase gate line disposed adjacent to the erase gate, and a second erase gate line disposed further apart from the erase gate than the first erase gate line.

11. The semiconductor device of claim 1,
wherein a structure of the PMOS capacitor comprises
a P-type well area (PW) disposed in the substrate;
a first high concentration P-type doping area (P+) and a second high concentration P-type doping area (P+) configured to be spaced apart from each other, and disposed in the P-type well area (PW); and
wherein the erase gate is disposed between the first high concentration P-type doping area (P+) and the second high concentration P-type doping area (P+).

12. The semiconductor device of claim 11,
wherein the second high concentration P-type doping area (P+) is disposed at a distance that is further from the erase gate in comparison with the first high concentration P-type doping area (P+).

13. A semiconductor device, comprising:
a single poly non-volatile memory device, comprising
a sensing and selection gate structure, including a selection gate and a sensing gate,
a bit line (BL) disposed adjacent to the sensing gate;
a word line (WL) disposed on the selection gate; and
a tunneling gate line (TG line) disposed adjacent to the selection gate, wherein the sensing gate is configured to perform a data programming operation;
an erase gate structure, including an erase gate configured to perform a data erase operation; and
a control gate structure, including a control gate which is configured to be connected to the erase gate and the sensing gate.

14. The semiconductor device of claim 13, wherein the erase gate structure is one of a P-type MOS capacitor, an N-type MOS transistor, and a P-type MOS transistor.

15. The semiconductor device of claim 13, wherein an area of the control gate is larger than an area of the erase gate.

16. The semiconductor device of claim 13, wherein the erase gate structure further comprises a first erase gate line disposed adjacent to the erase gate, and a second erase gate line disposed further apart from the erase gate than the first erase gate line is disposed from the erase gate.

* * * * *